United States Patent [19]
Carbonini

[11] Patent Number: 5,861,753
[45] Date of Patent: Jan. 19, 1999

[54] ELECTROMAGNETIC COMPATIBILITY (EMC) TEST CELL

[75] Inventor: Lorenzo Carbonini, Camogli, Italy

[73] Assignee: Thermo Voltek Europe B.V., United Kingdom

[21] Appl. No.: 759,482

[22] Filed: Dec. 5, 1996

[30] Foreign Application Priority Data

Jul. 23, 1996 [GB] United Kingdom .................... 9615462

[51] Int. Cl.$^6$ .................................................. G01R 31/02
[52] U.S. Cl. ............................................ 324/637; 324/641
[58] Field of Search .................................. 324/639, 637, 324/641; 333/636, 245, 248

[56] References Cited

U.S. PATENT DOCUMENTS

5,497,099  3/1996  Walton ..................................... 324/639

FOREIGN PATENT DOCUMENTS

0517992 A1  12/1992  European Pat. Off. .
0684657 A1  11/1995  European Pat. Off. .
WO 93/03387  2/1993  WIPO .

OTHER PUBLICATIONS

M.L. Crawford, "Generation of Standard EM Fields Using TEM Transmission Cells", *IEEE Transactions on Electromagnetic Compatibility*, vol. 16, pp. 189–195, Nov., 1974.

D. Königstein and D. Hansen, "A New Family of Tem–Cells with Enlarged Bandwidth and Optimized Working Volume", *Proceedings of the Seventh International Symposium on EMC*, pp. 127–132, Zurich 1987.

L. Carbonini, "Comparison of Analysis of a WTEM Cell With Standard TEM Cells for Generating EM Fields", IEEE Transactions of Electromagnetic Compatibility, vol. 35, No. 2, pp. 255–263, May, 1993.

F.B.J. Leferink, "A Triple–Tem Cell: Three Polarisations in One Setup", *Proceedings of the Tenth International Symposium on EMC*, pp. 573–578, Zurich 1993.

F.B.J. Leferink, "Triple–Tem Cell: A Simple Device for Immunity Testing", *Proceedings of the IEEE International Symposium on EMC*, pp. 455–459, 1994.

C. Wan, "Conformal Mapping Analysis of a Modified TEM Cell", *IEEE Transactions on Electromagnetic Compatibility*, vol. 35, No. 1, pp. 109–113, Feb., 1993.

L. Carbonini, "A Shielded Multi–Wire Transmission Line For Susceptibility Measurements with Horizontally Electric Field", *Eighth IEEE International Conference on EMC*, pp. 33–38, Edinburgh, Sep., 1992.

*Primary Examiner*—Maura K. Regan
*Attorney, Agent, or Firm*—Westman, Champlin & Kelly, P.A.; S. Koehler

[57] ABSTRACT

An electromagnetic compatibility (EMC) test cell has an electromagnetically screening enclosure which is rectangular in cross-section with a length and first and second pairs of opposed side walls. A first antenna array comprises a first array of conductors extending lengthwise in the enclosure distributed at positions between the first pair of side walls to produce, when energized in TEM-mode, an electric field in a first test region of the enclosure which is predominantly polarized in a direction parallel to the first pair of side walls. Second and third antenna arrays comprising respective second and third arrays of conductors extend lengthwise in the enclosure on opposite sides of the first test region. The conductors of each of the second and third arrays are distributed at positions between the second pair of side walls to produce, when energized in balanced TEM-mode, an electric field in a second test region between the second and third arrays which is predominantly polarized in a direction parallel to the second pair of side walls. Feeds connect to a feed end of the conductors of each array to energize the arrays, and impedance matched termination of the conductors of the arrays is provided. The resulting test cell can be energized either vertically or horizontally and provides a relatively large area of relatively uniform field.

22 Claims, 7 Drawing Sheets

ELECTROMAGNETIC COMPATIBILITY (EMC) TEST CELL

The present invention is concerned with apparatus for testing electrical and electronic equipment for electromagnetic compatibility (EMC). Enclosures for this purpose are known as EMC test cells.

There is an increasing practical and regulatory requirement for ensuring that electrical and electronic equipment does not emit excessive levels of electromagnetic radiation (produce electromagnetic interference (EMI)), and that electronic equipment in particular is not susceptible to faulty operation or damage caused by external electromagnetic radiation. Enclosures designed for testing equipment for their electromagnetic compatibility are known as EMC test cells, or sometimes EMI test cells. There is thus an increasing demand for inexpensive and reliable EMC test cells which are capable of testing equipment so as to meet the various Standards set down by the regulatory authorities.

In order to test electronic equipment the aim is to generate a homogeneous electromagnetic wave under free space conditions. This can be simulated by a guided wave of the TEM (Transverse Electromagnetic) mode travelling between two flat conducting plates. In this mode, the electric field component is perpendicular and the magnetic field component parallel to the conducting plates.

In existing EMC test cell designs, the above fundamental structure is embodied in a generally tubular or rectangular section enclosure containing a plate like conductor arranged generally parallel to an opposed pair of the side walls of the enclosure. A test region is then defined within the enclosure between the interior conducting plate and one of the side walls. In order to enlarge the test region to accommodate larger equipments under test (EUTs), some designs have located the interior conducting plate asymmetrically so as to be relatively nearer one of the side walls.

Known cells of this kind are described in the following articles:

1. M. L. Crawford, "Generation of Standard EM Fields Using TEM Transmission Cells", IEEE Transactions on Electromagnetic Compatibility, Vol.16, pp.189–195, November 1974 (The TEM Cell);
2. D. Königstein and D. Hanson, "A New Family of TEM Cells with Enlarged Bandwidth and Optimised Working Volume", Proceedings of the Seventh International Symposium on EMC, Zurich 1987 (known as The G-TEM Cell);
3. L. Carbonini, "Comparison of Analysis of a W-TEM Cell with Standard TEM Cells for Generating EM Fields", IEEE Transactions on Electromagnetic Compatibility, Vol.35, No.2, May 1993 (known as the W-TEM Cell).

It has been discovered that there are advantages in replacing a flat plate central conductor within the cell by a parallel array of elongate conductors, i.e. wires or rods for example. Reference 3 above exploits the use of individual conductors in a curved array (seen in cross-section) rather than the usual planar array.

Existing testing standards require the EUT to be tested with two orthogonal field polarizations, e.g. vertical and horizontal with reference to a ground plane. The equipment described in the above references can produce fields only in one polarization, typically vertical, and so the EUT must be rotated within the enclosure about a horizontal axis in order to test to the required standards. This usually requires the cell to be opened and the equipment physically manipulated on the testing platform within the cell.

One cell design providing multiple field polarities within the cell is disclosed in 4. F. B. J. Leferink, "A Triple TEM Cell: Three Polarisation in One Set Up", Proceedings of Tenth International Symposium on EMC, pp.573–578, Zurich 1993: and
5. F. B. J. Leferink, "Triple TEM Cell: A Simple Device for Immunity Testing", Proceedings of the IEEE International Symposium on EMC pp. 455–459, 1994. (Known as the TRIPLE-TEM CELL).

This cell is similar to the G-TEM (2) with a square cross-section enclosure and two distinct inner conducting plates (or septa) which can be fed independently for either vertical or horizontal field polarization. Polarization in a third orthogonal direction relative to the EUT is provided by rotating the EUT on a turntable about a vertical axis.

A concern with all existing EMC test cells is to provide good field uniformity over the test region with minimal cross polarization of the field, i.e. field strength in the direction transverse to the desired polarity. A field uniformity over the test region of ±3 dB is desired and a cross polarity less than −6 dB. Another design aim is to ensure that the test region within the cell which meets the above field uniformity and cross polarity conditions is a usefully large proportion of the enclosed volume within the enclosure of the cell. Finally there is a desire for the testing cell to operate over a wide frequency range, preferably in excess of 1 GHz.

The above referred TRIPLE-TEM cell (4,5) has relatively low field uniformity and a high cross polarization level within a usable test region in the cell.

Another design for electromagnetic susceptibility measurements is disclosed in

6. L. Carbonini, "A Shielded Multi Wire Transmission Line for Susceptibility Measurements with Horizontally Polarised Electric Field", Eighth IEEE International Conference on EMC, Edinburgh, September 1992.

This design intended for the electromagnetic susceptibility testing of whole aircraft uses two planar wire arrays within a screening enclosure. The enclosure is formed partly by the ground itself with side walls and top formed by parallel wire arrays, rather than continuous conducting surfaces. Two vertical planar arrays of horizontally extending wires form the inner wire arrays, on opposite sides of a test region which may accommodate an aircraft. The inner planar wire arrays are balance fed via a balun transformer. The resulting horizontally polarized TEM mode field between the two inner planar wire arrays can be described as a "balanced TEM mode".

The design described in the above reference (6) exhibits a relatively low field strength within the test region for a specified power input to the inner conductor arrays. Importantly, the arrangement described in the references is clearly not suitable for testing relatively small electronic equipment and has a very limited frequency range.

The present invention provides an electromagnetic compatibility (EMC) test cell comprising an electromagnetically screening enclosure which is rectangular in cross-section and has a length and first and second pairs of opposed side walls, a first antenna array comprising a first array of conductors extending lengthwise in the enclosure and being distributed at positions between said first pair of side walls to produce, when energized in TEM-mode, an electric field in a first test region of the enclosure which is predominantly polarized in a direction parallel to said first pair of side walls, second and third antenna arrays comprising respective second and third arrays of conductors extending lengthwise in the enclosure on opposite sides of said first test region, the conductors of each of said second and third arrays being distributed at positions between said second pair of side walls to produce, when energized in balanced TEM mode, an electric field in a second test region between said second and third arrays which is predominantly polarized in a direction parallel to said second pair of side walls, feed means connected at a feed end of the conductors of each said arrays for respectively energizing the arrays, and termination means at a termination end of the conductors of each said arrays to provide impedance matched termination of each conductor of the arrays.

With this arrangement a test cell is provided which can produce fields in either of two orthogonal polarizations. The optimum test region having the required level of field uniformity and cross polarization, for the field produced by the second and third antenna arrays (typically a horizontally polarized field), can be as high as approximately 50% of the total height and width of the screening enclosure. When the field of orthogonal polarization, typically vertical, is produced by energizing the first antenna array alone, the optimum test region is relatively smaller, but still greater than that achieved by the prior art TRIPLE-TEM (4,5).

Conveniently, said first antenna array comprises an array of conductors distributed in a plane perpendicular to said first pair of side walls. Preferably, said first array then includes at least one additional conductor, at each side of the array, which is positioned on the side of said plane nearer to said test region. These additional conductors have been found to substantially increase the extent of the optimum test region for the field polarization produced by said first antenna array, especially in the polarization direction.

Preferably at least five conductors are distributed in said plane for the first antenna array.

In a preferred embodiment, a fourth antenna array is provided comprising a fourth array of conductors extending lengthwise in the enclosure and being distributed at positions between said first pair of side walls on the opposite side of said test region relative to said first array, said feed means being arranged for simultaneously energizing said first and fourth arrays in balanced TEM mode.

With this embodiment, the optimum test region for the polarization direction parallel to said first pair of side walls can be comparable to the optimum test region size for the orthogonal polarization direction.

In a further preferred embodiment, each of said second and third arrays may comprise an array of conductors distributed in a respective plane perpendicular to said second pair of side walls and at least one additional conductor positioned between said respective plane and the adjacent one of said first pair of side walls. A similar construction may be provided for the first and fourth arrays. Then each of the arrays may comprise at least five conductors distributed in the respective plane and at least two additional conductors between the respective plane and the adjacent side wall.

This construction for pairs of opposed arrays energized in balanced mode, enables the field strength generated between the arrays to be maximized while still maintaining a desired level of characteristic transmission impedance for the arrays.

Conveniently, said screening enclosure has a feedthrough formed in the side wall of said second pair which is adjacent to said fourth antenna array, said feedthrough being suitable for supply and test cables to equipment under test in the cell, and said fourth array comprises two groups of conductors, one group extending on each side of said feedthrough.

Preferably, the screening enclosure is square in cross-section over at least a portion of its length containing said first and second test regions. Desirably, the first and second test regions overlap, and more preferably substantially coincide.

Examples of the present invention will now be described with reference to the accompanying drawings in which.

Figure 1:
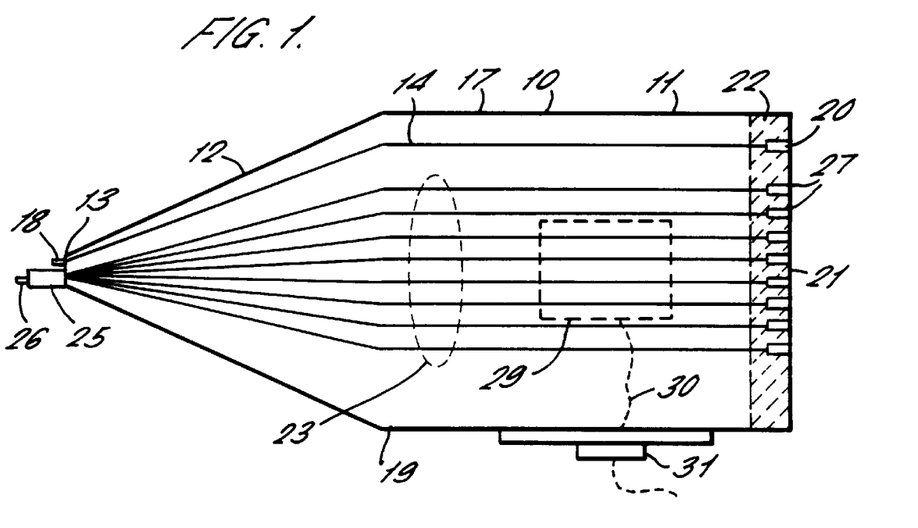
FIG. 1 is a cross-sectional view in side elevation of an EMC test cell embodying the present invention.
Figure 2:
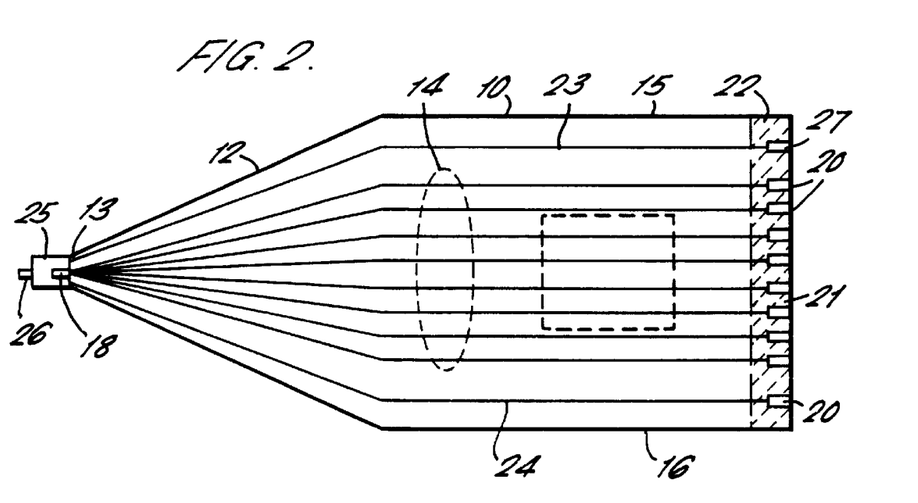
FIG. 2 is a cross-sectional view from above of the test cell illustrated in FIG. 1.
Figure 3:
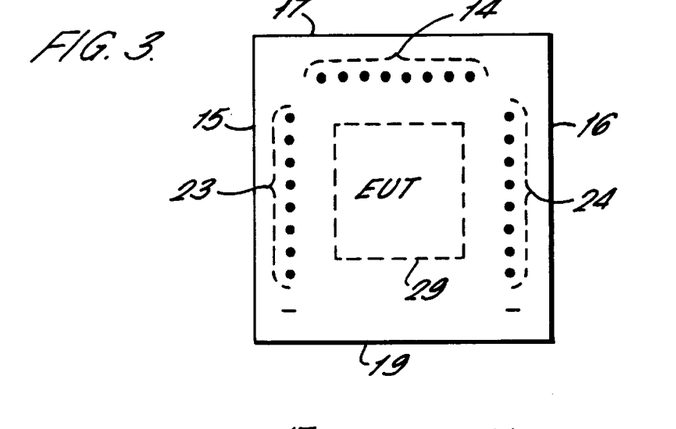
FIG. 3 is a cross-sectional view of a test cell transversely of the length of the cell and showing the distribution of conductors forming the antenna arrays in the cell.
Figure 4:
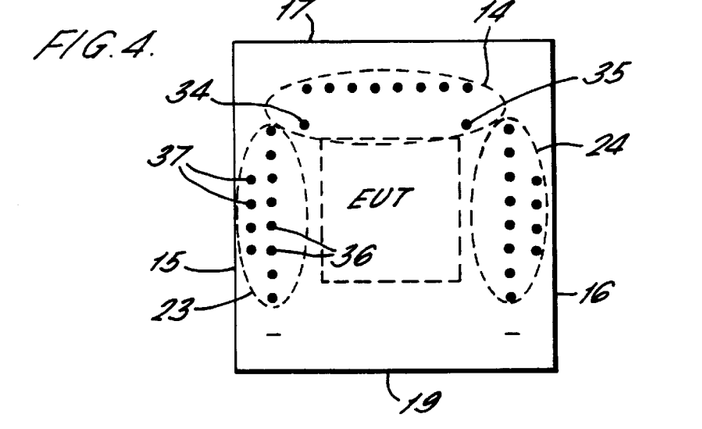
FIG. 4 is a cross-sectional view corresponding to that of FIG. 3 illustrating a preferred distribution of the array conductors.
Figure 5:
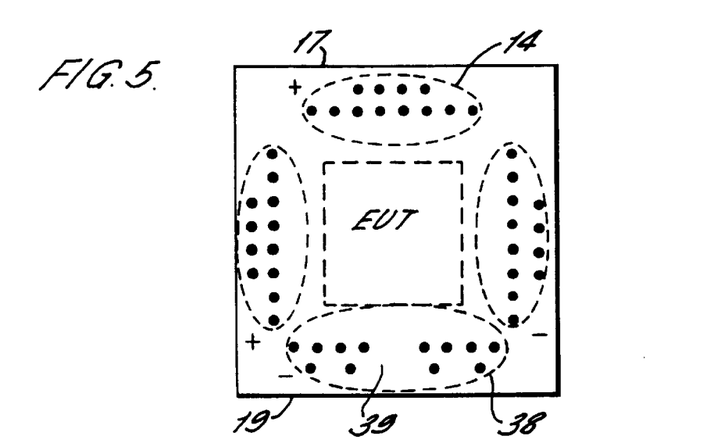
FIG. 5 is another cross-sectional view corresponding to that of FIG. 3 and illustrating a further preferred distribution of the array conductors.

Referring to FIGS. 1 and 2, an EMC testing cell comprises an electromagnetically screening enclosure 10. The enclosure 10 has a testing part 11 which has uniform square cross-section (as illustrated in FIGS. 3 to 5) and a flared transition section 12 leading to the testing section 11 from an antenna feed end 13.

The screening enclosure 10 contains a first array 14 of conductors extending lengthwise along the enclosure. The conductors of the array 14 are distributed in a plane perpendicular to side walls 15 and 16 of the enclosure and parallel to the top 17 of the enclosure. In the transition section 12 of the enclosure, the conductors of the array 14 fan out from a common connector 18 at the apex 13 of the tapered transition section 12.

In operation, the connector 18 may be connected to an RF signal source to energize the antenna array 14. Energizing of the array 14 produces a TEM-mode propagation of the RF energy along the transmission line formed by the conductors of the array 14 in combination with the top 17 and the base 19 of the enclosure 10 and coupled with all the other metal structures inside the cell.

The ends of the conductors of the array 14 opposite to the feed connector 18 are terminated by resistors 20 connecting the conductors to the casing 10. In addition, the end face 21 of the casing 10 is internally coated with an RF absorbing layer 22. The value of the termination resistances 20 are selected to match the characteristic impedance of the respective conductor of the array 14. In this way, low frequency energy propagating along the conductors of the array 14 is dissipated in the resistors 20 and higher frequency RF energy is dissipated in the absorbing layer 22. The combination of resistors 20 and absorbing layer 22 is intended to provide a matching termination to the transmission line to minimize voltage standing wave ratio (VSWR) and to reduce the production of higher modes of propagation within the enclosure 10.

The arrangement within the enclosure 10 of the conductors of the array 14 can be seen in FIG. 3. As can be seen, energizing the antenna array 14 produces an electric field which is essentially vertically polarized, at least in a central region between the side walls 15 and 16.

The enclosure 10 additionally includes second and third antenna arrays 23 and 24. Each of the antenna arrays 23 and 24 comprises an array of conductors extending lengthwise along the enclosure 10 in a respective plane perpendicular to the top 17 and base 19 of the enclosure and parallel to side walls 15 and 16. The vertically extending array 23 is adjacent one side wall 15 and the array 24 is adjacent the opposite side wall 16. The conductors of the arrays 15 and 16 fan out from a feed device 25 located at the apex 13 of the transition section 12 of the enclosure. The feed device 25 comprises a balun interconnecting the arrays 23 and 24 to a connector 26.

When an RF signal supply is connected to the connector 26, the balun 25 provides balanced energizing of the two arrays 23 and 24, i.e. equal signals of opposite phase are supplied to each of the two arrays. This produces a balanced TEM-mode propagation between the arrays 23 and 24.

As for the first array 14, the second and third arrays 23 and 24 are terminated by resistors 27 and 28 respectively. The resistors 27 and 28 are selected to provide matching termination of each of the conductors of the arrays.

As can be seen from FIG. 3, energizing the arrays 23 and 24 in balanced TEM-mode produces a generally horizontally polarized electric field between the two arrays.

An equipment under test (EUT) 29 may be located in the space between the arrays 23 and 24 and beneath the array 14 and selectively exposed to vertically or horizontally polarized electric fields as required. During test, the EUT is connected to the outside world for monitoring via an umbilical line 30 which passes through an RF filtering feedthrough 31. In this way, the performance of the EUT when exposed to various levels and frequencies of electromagnetic radiation can be monitored. Similarly, the electromagnetic interference performance of the EUT 29 can be monitored by powering up and operating the EUT while monitoring signals detected by the antenna arrays with equipment connected to the connectors 18 and 26.

Figure 6:
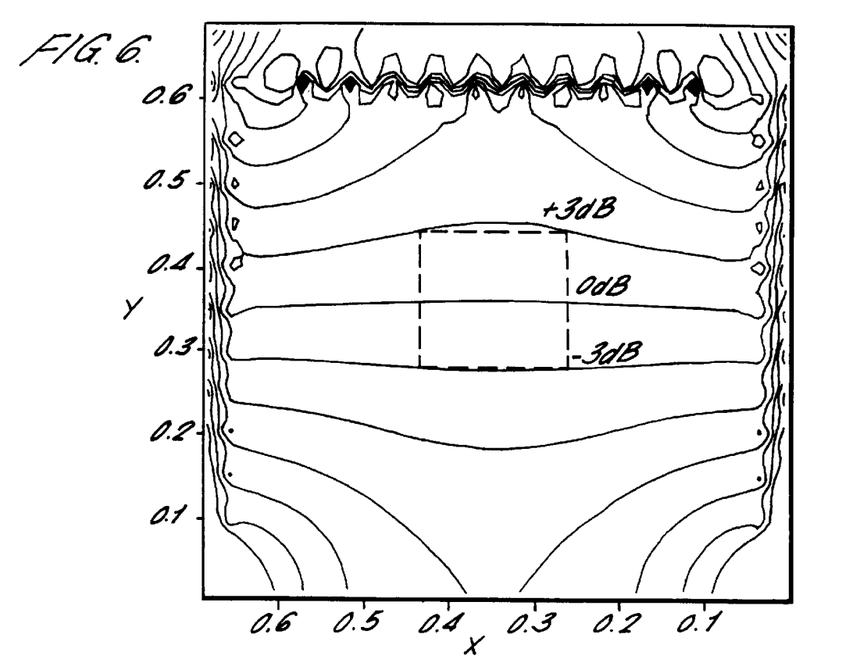
FIG. 6 is a cross-sectional view of a test cell showing a plot of variations of field strength within the cell for the vertical direction of polarization for the array conductor distribution of FIG. 3.

FIG. 6 illustrates the variation of field strength in the enclosure for vertically polarized fields generated by energizing the first antenna array 14 on its own. In FIG. 6, lines of equal field strength are shown across the cross-section of the cell. The equal field lines are at 3 dB intervals.

Figure 7:
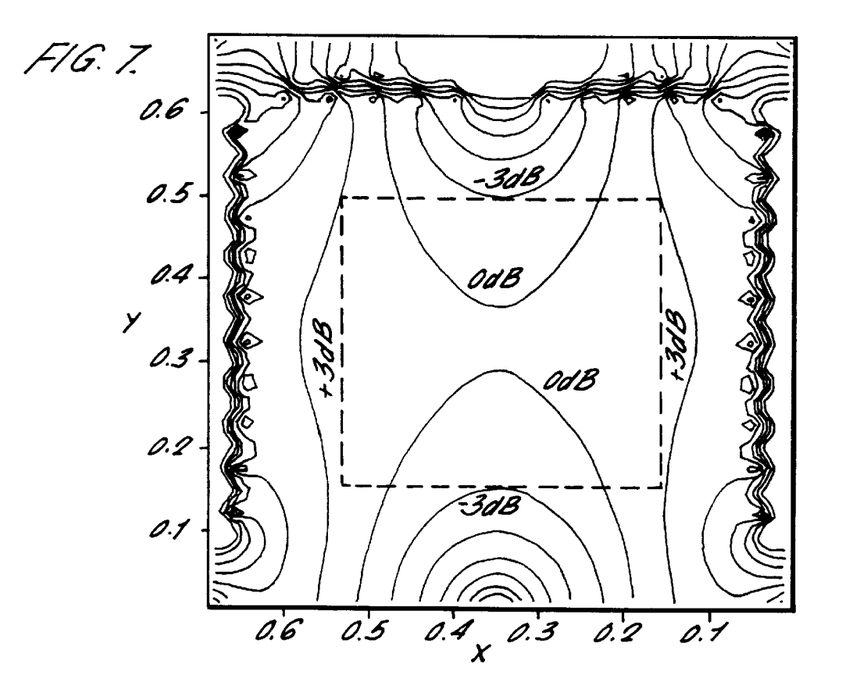
FIG. 7 illustrates a plot of the variation of field strength in the horizontal polarisation for the conductor distribution of FIG. 3.

Similarly, FIG. 7 illustrates the equal field lines for the horizontally polarized field produced by energizing the second and third antenna arrays in balanced mode.

As explained previously, to meet the requirements of the various regulatory Standards, the field strength over a test region within the cell must be uniform within ±3 dB. It can be seen that this constraint provides a substantially greater test region for horizontally polarized fields, as illustrated in FIG. 7, than for vertically polarized fields as illustrated in FIG. 6. In addition, cross polarization fields should be below −6 dB and this limits the useful width of the optimum test region for vertically polarized fields. Nevertheless, with the arrangement of conductors illustrated in FIG. 3, an optimum test region for horizontally polarized fields of 54% of the width of the test cell and 44% of the height of the test cell can be achieved, and for vertically polarized fields, 31% of the width of the test cell and 21% of the height. This is very significantly better for horizontally polarized fields than the prior art TRIPLE-TEM cell and is also rather surprisingly somewhat better for vertically polarized fields. In the TRIPLE-TEM which is symmetrical for vertical and horizontal fields, only 19% and 27% respectively of the width or height of the cell can be used for locating test equipment.

Figure 8:
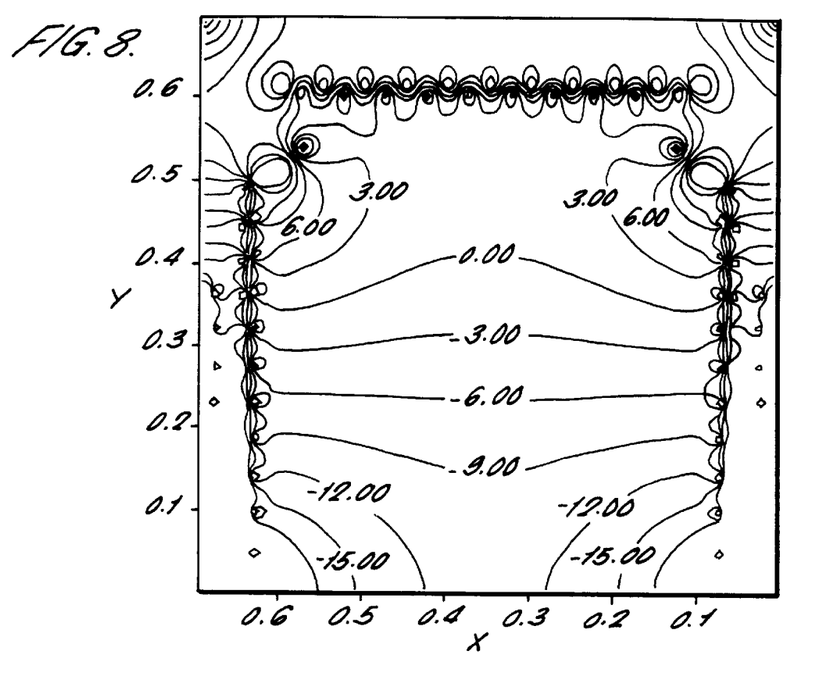
FIGS. 8 and 9 are corresponding vertical and horizontal polarization field strength plots for the conductor distribution of FIG. 4.

FIG. 4 illustrates an alternative arrangement of conductors for the antenna array 14 which can increase the size of the optimum test region for vertical polarization. In the arrangement shown in FIG. 4, two additional conductors 34 and 35 are located at opposite ends of the array. The conductors 34 and 35 are not spaced in the plane of the other conductors of the array 14 but instead are placed on the side of the plane of the array closer to the interior of the test cell and the EUT. As before, for vertical polarization, all the conductors of the array 14 including conductors 34 and 35 are energized simultaneously. When correctly terminated the performance for vertical polarization can be substantially improved as illustrated in FIG. 8 which again shows lines of constant electric field for vertical polarization. It can be seen that the region for which the field is uniform between ±3 dB now extends from just beneath the plane of the array 14 of inductors to substantially the middle of the test cell. In fact, taking cross polarization into account, the optimum test region can now be up to 38% of the width of the cell and up to 29% of the height.

Figure 9:
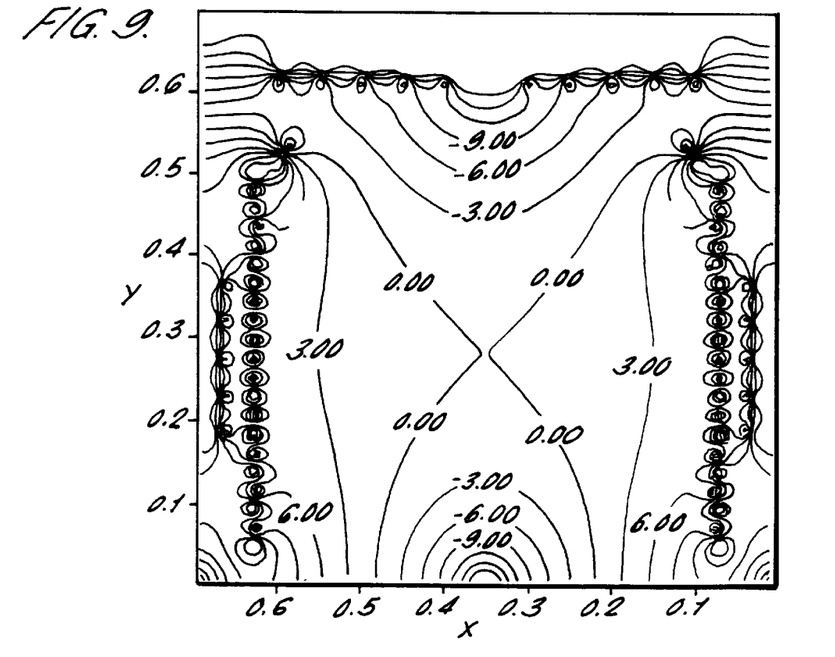

As shown in FIG. 9, the horizontal field performance of the test cell is not substantially degraded, though the optimum test region for horizontal polarization is now 50% of the width and 33% of the height.

In the arrangement of conductors illustrated in FIG. 4, the second and third arrays 15 and 16 are also modified. As shown, each of the arrays 15 and 16 comprises a first array of inner conductors 36 in a plane parallel to the side wall 15 and a second array of outer conductors 37 in a further parallel plane located between the plane of the conductors 36 and the side wall 15. The third conductor array 24 is formed similarly.

When designing the test cells, it is important that the characteristic impedance of the respective transmission lines formed by the arrays of conductors within the cell is appropriately matched to external test systems. Typically this requires matching to 50 Ohm at the connectors 18 and 26 for example. In order to match the balanced transmission line comprising the conductor arrays 23 and 24 to a characteristic impedance of 50 Ohm, the conductors of the arrays 23 and 24 must be located relatively close to the adjacent side walls 15 and 16 of the enclosure. This provides relatively inefficient provision of field between the conductor arrays so that more power must be delivered to the arrays to achieve a designed field strength. It has been found that optimum field strength performance can be achieved by moving the arrays 23 and 24 further from the adjacent side walls of the enclosure, but this has the effect of increasing the characteristic impedance of the transmission line to about 70 Ohm. Transmission line transformers allow wide band matching only if the impedance ratio is 1:1 or 1:4. By placing the additional conductors 37 between the inner array of conductors 36, the resulting compound arrays provide the advantages of a 50 Ohm characteristic impedance and the higher field strength for the same power input in the region between the arrays. In order to achieve a minimum field strength of 20 volts per meter for horizontally polarized fields in a nominal size of cell with a cross-section 700 mm square, an input power of 4.55 W is required for the modified array design illustrated in FIG. 4, whereas an input power of 9.6 W was required for the design illustrated in FIG. 3, both being optimized for 50 Ohm characteristic impedance.

Referring now to FIG. 5, a further modification of the design for improving the vertical polarization field performance is illustrated. In this arrangement, a fourth array 38 is provided adjacent the base 19 of the cell. The first array 14 and the fourth array 38 are now fed via a balun transformer similar to transformer 25 already provided for the horizontal field arrays 23 and 24. Thus, the vertical field is now also provided in balanced TEM-mode. The array 38 is shown separated in two parts on either side of a space 39 which enables a testing umbilical to be fed through the array to the EUT within the cell. The space 39 may be sufficiently large to allow the EUT to be placed in the cell through the base.

Figure 10:
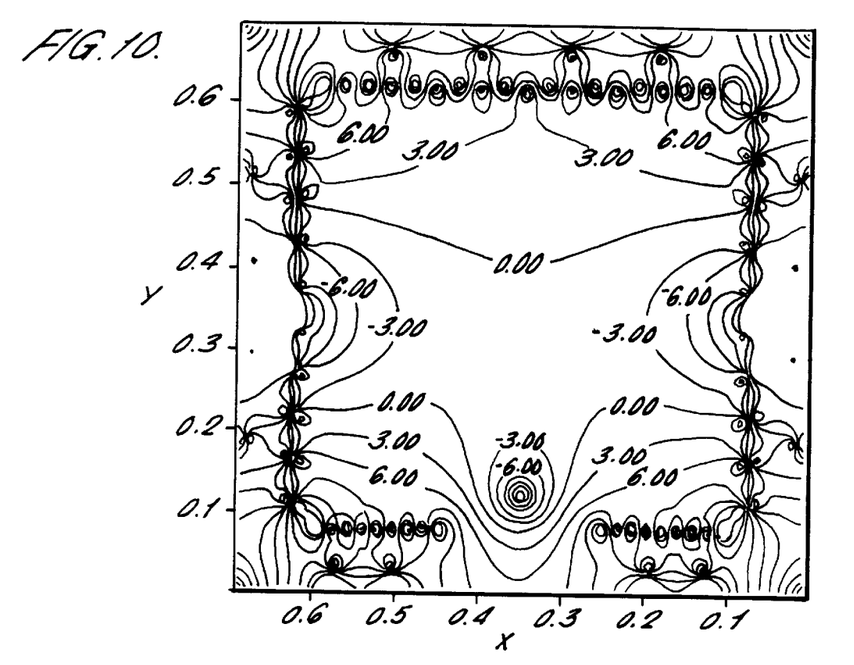
FIGS. 10 and 11 are corresponding plots for the conductor distribution of FIG. 5.
Figure 11:
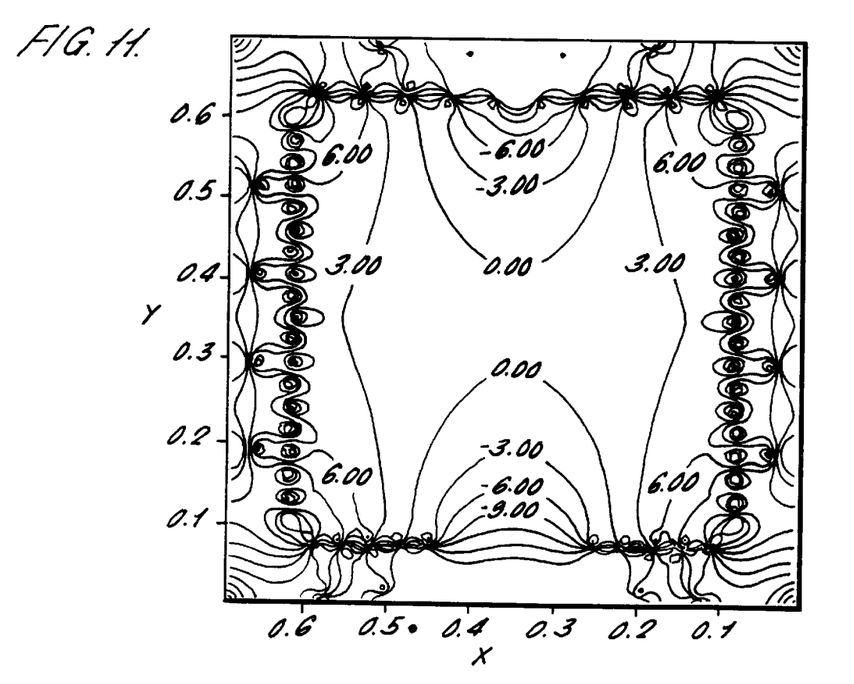

Both the first array 14 and the fourth array 38 are provided with the additional conductors between the main plane of conductors and the adjacent wall of the cell, here the top 17 and the base 19, in order to provide both optimum field strength within the cell and a 50 ohm characteristic impedance. The performance of the fully symmetric cell with balanced configurations for both vertical and horizontal polarization is illustrated in FIGS. 10 and 11. The optimum test region for the symmetric cell illustrated can be 46% of the width and 42% of the height of the cell for horizontal polarization and 40% of the width and 47% of the height of the cell for vertical polarization.

A drawback with using a fully symmetric arrangement as illustrated in FIG. 5 may be the frequency limitations of the balun transformers needed to drive the arrays for both vertical and horizontal polarisation.

Figure 12:
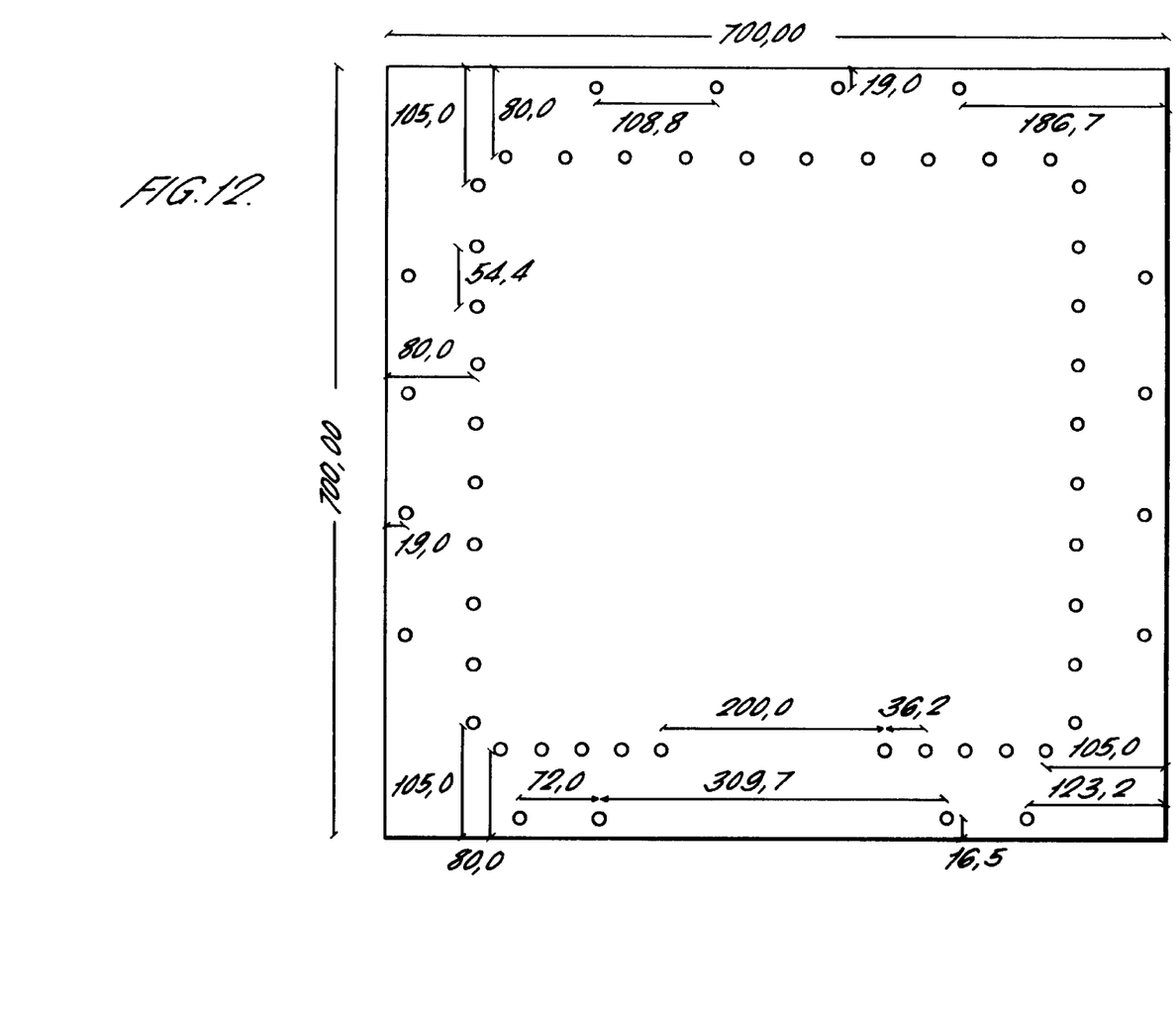
FIG. 12 is a further cross-sectional view of a cell illustrating the positions of the conductors within the enclosure in more detail.

FIG. 12 illustrates the dimensions and relative positions of the conductors of the various arrays in a particular embodiment of cell. The nominal size of the cell cross-section is 700 mm square. The dimensions shown in the drawing are all in millimeters.

Figure 13:
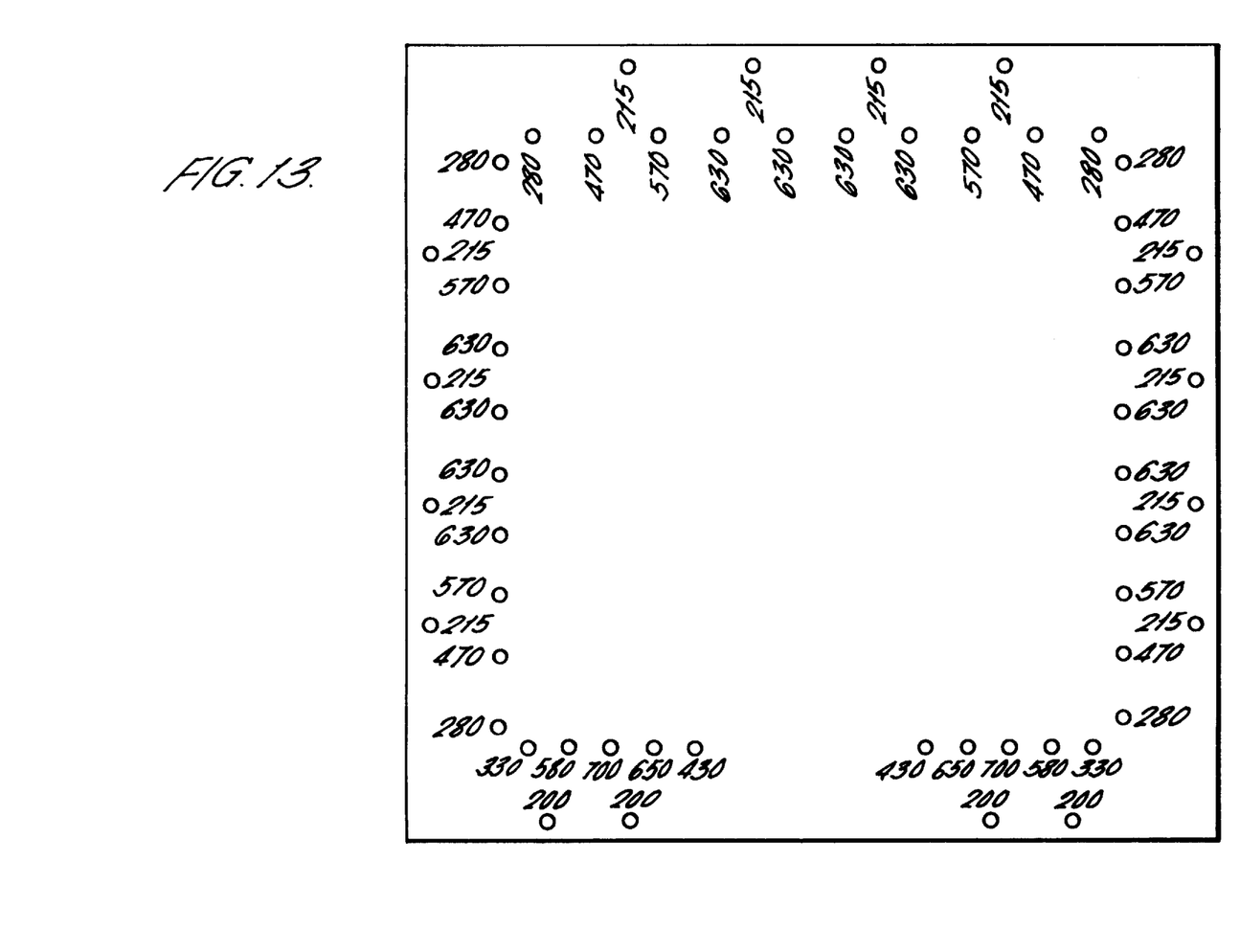
FIG. 13 is a cross-sectional view corresponding to that of FIG. 12 and tabulating the termination resistances used for each of the conductors in accordance with a preferred embodiment.

FIG. 13 illustrates the value of the various resistors used to terminate each of the conductors of the arrays in the cell. These resistors are selected to provide matching termination of each individual conductor while overall providing a resistive termination corresponding to the characteristic impedance of the transmission lines formed by the opposed pairs of arrays.

The following table provides test results for the various forms of test cell illustrated and compares these with the results for the TRIPLE-TEM construction of the prior art, all for a nominal cell size with a cross-section 700 mm square. It will be appreciated that the dimensions of the embodiments of cell described herein and used for the following test results are by way of example only. Larger or smaller cells may also be designed.

In the above table, $E_{ref}$ is a reference field strength at a central region of the test area of the cell for an input power of 1 W.

Cross polarization is defined as 20 Log ($E_{CROSS}/E_{CO}$), where $E_{CROSS}$ is the (undesired) cross polarised electric field component and $E_{CO}$ is the (desired) co-polarized electric field component.

The optimum test region is the area of overlap between the ±3 dB test region and the test region with cross polarization lower than −6 dB.

The parameter generation efficiency is $$20 \text{Log}\left(\frac{E_{ref}}{E_{id}}\right) (dB)$$

where $$E_{id} = \sqrt{\frac{P \cdot Z_0}{S}}$$

is the ideal field value which would be obtained if the full input power to the transmission line flows through the test region with cross-sectional area S. This parameter, generation efficiency takes into account the field level and field uniformity at the same time. It exhibits a maximum possible value of 0 dB which cannot be obtained in real devices. The parameter is invariant with scale.

The final parameter Power is the input power required to obtain 20 volts per meter minimum field in the test region. This parameter highlights the efficiency of the different devices compared.

It should be appreciated that the modified antenna design for the second and third arrays 15 and 16 in FIGS. 3 and 4 and also for the first and fourth arrays in FIG. 4 can be applied to other configurations of test cell. For example a single polarisation cell using balanced opposed plate-like antenna members may be modified by the provision of additional conductors between each of the antenna plates and the adjacent side wall of the enclosure, in order to change or "trim" the characteristic impedance of the antennas in the cell.

What is claimed is:

1. An electromagnetic compatibility (EMC) test cell comprising an electromagnetically screening enclosure which is rectangular in cross-section and has a length and first and second pairs of opposed side walls, a first antenna array comprising a first array of conductors extending lengthwise

|  |  |  | Parameters |  |  |  |
| --- | --- | --- | --- | --- | --- | --- |
| Device | $E_{ref}$ @ 1 W (V/m) | Region Electric Field ± 3 dB (% W × % H) | Region Cross Polarisation <−6 dB (% W × % H) | Optimum Test Region (% W × % H) | Generation Efficiency (DB) | Power (W) @ 20 V/m min. |
| FIG. 3 arrangement, H-pol. | 6.34 | 54% × 48% | 81% × 44% | 54% × 44% | −19.1 | 9.9 |
| FIG. 3 arrangement, V-pol. | 9.90 | 42% × 21% | 31% × 83% | 31% × 21% | −20.8 | 4.1 |
| FIG. 4 arrangement, H-pol. | 9.34 | 50% × 44% | 74% × 39% | 50% × 39% | −16.6 | 4.6 |
| FIG. 4 arrangement, V-pol. | 13.4 | 40% × 34% | 30% × 83% | 30% × 34% | −16.2 | 2.22 |
| FIG. 5 arrangement, H-pol. | 9.00 | 46% × 46% | 72% × 42% | 46% × 42% | −16.9 | 4.43 |
| FIG. 5 arrangement, V-pol. | 9.00 | 42% × 47% | 40% × 63% | 40% × 47% | −17.0 | 4.43 |
| Prior Art (TRIPLE-TEM), H-pol. | 12.27 | 19% × 35% | 83% × 27% | 19% × 27% | −20.0 | 2.7 |
| Prior Art (TRIPLE-TEM), V-pol. | 12.27 | 35% × 19% | 27% × 83% | 27% × 19% | −20.0 | 2.7 | in the enclosure and being distributed at positions between said first pair of side walls to produce, when energized in TEM-mode, an electric field in a first test region of the enclosure which is predominantly polarized in a direction parallel to said first pair of side walls, second and third antenna arrays comprising respective second and third arrays of conductors extending lengthwise in the enclosure on opposite sides of said first test region, and the conductors of each of said second and third arrays being distributed at positions between said second pair of side walls to produce, when energized in balanced TEM-mode, an electric field in a second test region between said second and third arrays which is predominantly polarized in a direction parallel to said second pair of side walls, feed means connected at a feed end of the conductors of each said array for respectively energizing the arrays, and termination means at a termination end of the conductors of each said array to provide impedance matched termination of each conductor of the arrays.

2. A test cell as claimed in claim 1, wherein said first antenna array comprises an array of conductors distributed in a plane perpendicular to said first pair of side walls.

3. A test cell as claimed in claim 2, wherein said first array includes at least one additional conductor, at each side of the array, which is positioned on the side of said plane nearer to said test region.

4. A test cell as claimed in claim 2, wherein at least five conductors are distributed in said plane.

5. A test cell as claimed in claim 1 and including a fourth antenna array comprising a fourth array of conductors extending lengthwise in the enclosure and being distributed at positions between said first pair of side walls on the opposite side of said test region relative to said first array, said feed means being arranged for simultaneously energizing said first and fourth arrays in balanced TEM-mode.

6. A test cell as claimed in claim 5, wherein each of said first and fourth arrays comprises an array of conductors distributed in a respective plane perpendicular to said first pair of side walls and at least one additional conductor positioned between said respective plane and the adjacent one of said second pair of side walls.

7. A test cell as claimed in claim 6, wherein each of said first and fourth arrays comprises at least five conductors distributed in said respective plane and at least two additional conductors positioned between said respective plane and said adjacent side wall.

8. A test cell as claimed in claim 5, wherein said screening enclosure has a feedthrough formed in the side wall of said second pair which is adjacent said fourth antenna array, said feedthrough being suitable for supply and test cables to equipment under test in the cell, and said fourth array comprises two groups of conductors, one group extending on each side of said feedthrough.

9. A test cell as claimed in claim 1, wherein each of said second and third arrays comprises an array of conductors distributed in a respective plane perpendicular to said second pair of side walls and at least one additional conductor positioned between said respective plane and the adjacent one of said first pair of side walls.

10. A test cell as claimed in claim 9, wherein each of said second and third arrays comprises at least five conductors distributed in said respective plane and at least two additional conductors positioned between said respective plane and said adjacent side wall.

11. A test cell as claimed in claim 1, wherein said screening enclosure is square in cross-section over at least a portion of its length containing said first and second test regions.

12. A test cell as claimed in claim 1, wherein said first and second test regions overlap.

13. An electromagnetic compatibility (EMC) test cell comprising an electromagnetically screening enclosure which is rectangular in cross-section and has a length and first and second pairs of opposed side walls, first and second opposed antennas extending lengthwise in the enclosure, each said antenna comprising at least one conductor forming a geometrical surface which is at least longitudinally conductive and is spaced from an adjacent one of said first pair of side walls, said antenna surfaces being positioned to produce, when the antennas are energized in balanced TEM-mode, an electric field in a test region between said antenna surfaces which is predominantly polarized in a direction parallel to said second pair of side walls, feed means connected at a feed end of the respective conductors of the antennas for energizing the antennas, and termination means at a termination end of the respective conductors to provide impedance matched termination of each antenna, wherein each said antenna includes at least one additional lengthwise extending conductor positioned between the respective surface and the adjacent one of said first pair of side walls.

14. An electromagnetic compatibility (EMC) test cell comprising an electromagnetically screening enclosure which is rectangular in cross-section and has a length and first and second pairs of opposed side walls, at least a first antenna extending lengthwise in the enclosure, said antenna comprising at least one conductor and forming a geometrical surface which is at least longitudinally conductive and is spaced from an adjacent one of said pair of side walls, said antenna surface being positioned to produce, when energized in TEM-mode, an electric field in a test region between said antenna surface and the other of said first pair of side walls, said field being predominantly polarized in a direction parallel to said second pair of side walls, feed means connected at a feed end of said at least one conductor of the antenna for energizing the antenna, and termination means at a termination end of said at least one conductor to provide impedance matched termination of the antenna, wherein said antenna includes at least one additional lengthwise extending conductor positioned between said antenna surface and said adjacent one of said first pair of side walls.

15. A test cell as claimed in claim 14, including a second antenna extending lengthwise in the enclosure and comprising at least one conductor and forming a geometrical surface which is at least longitudinal conductive and is adjacent to and spaced from the other of said first pair of side walls, the surfaces of said first and said second antennas being positioned to produce, when energized in balanced TEM-mode, said electric field, said test region being between said antenna surfaces, said feed means being connected at the feed end of the respective conductors of both the first and second antennas, and said termination means being at the termination end of the conductors to provide impedance matched termination of both said antennas.

16. A test cell as claimed in claim 15, wherein said second antenna includes at least one additional lengthwise extending conductor positioned between said second antenna surface and said other of said first pair of side walls.

17. A test cell as claimed in claim 14, wherein at least said first antenna comprises a plate-like conductor extending in said geometrical surface.

18. A test cell as claimed in claim 14, wherein at least said first antenna comprises an array of said longitudinal conductors distributed to form said geometrical surface.

19. A test cell as claimed in claim 14, wherein said geometrical surface of at least said first antenna is planar.

20. A test cell as claimed in claim 14, wherein at least said first antenna has at least two said additional lengthwise extending conductors between said antenna surface and said adjacent side walls of the enclosure.

21. A test cell as claimed in claim 20, wherein at least said first antenna comprises an array of at least four longitudinal conductors distributed to form said geometrical surface.

22. A test cell as claimed in claim 21, wherein at least said first antenna comprises an array of between six and twelve longitudinal conductors forming said geometrical surface and between three and six additional longitudinal conductors between said geometrical surface and the adjacent side walls of the enclosure.

* * * * *

UNITED STATES PATENT AND TRADEMARK OFFICE
CERTIFICATE OF CORRECTION

PATENT NO. : 5,861,753
DATED : Jnauary 19, 1999
INVENTOR(S) : Lorenzo Carbonini

It is certified that error appears in the above-indentified patent and that said Letters Patent is hereby corrected as shown below:

On the title page, item

[56]    References Cited
          OTHER PUBLICATIONS Publication No. 7, line 2, after "Horizontally" insert --Polarized--.

Signed and Sealed this

Twenty-fifth Day of May, 1999

Attest:

Q. TODD DICKINSON

*Attesting Officer*      Acting Commissioner of Patents and Trademarks